(12) United States Patent
Bushby et al.

(10) Patent No.: US 8,240,485 B2
(45) Date of Patent: Aug. 14, 2012

(54) CHASSIS AND MODULE FOR DATA STORAGE DEVICE ENCLOSURE AND METHODS OF RECONFIGURING CHASSIS AND MODULE

(75) Inventors: Paul Bushby, Sompting (GB); Mark Scicluna, Long Sutton (GB)

(73) Assignee: Xyratex Technology Limited, Havant (GB)

( * ) Notice: Subject to any disclaimer, the term of this patent is extended or adjusted under 35 U.S.C. 154(b) by 1078 days.

(21) Appl. No.: 12/216,216

(22) Filed: Jul. 1, 2008

(65) Prior Publication Data

US 2009/0009954 A1 Jan. 8, 2009

Related U.S. Application Data

(60) Provisional application No. 60/929,566, filed on Jul. 3, 2007.

(51) Int. Cl.
*A47F 7/00* (2006.01)
(52) U.S. Cl. ........................................................ 211/26
(58) Field of Classification Search ............... 211/26, 211/151, 162, 126.15, 126.16, 72, 135; 312/223.2, 312/260, 261; 206/701, 722
See application file for complete search history.

(56) References Cited

U.S. PATENT DOCUMENTS

| | | | | |
|---|---|---|---|---|
| 5,211,459 | A * | 5/1993 | Wu | 312/223.2 |
| 5,584,396 | A * | 12/1996 | Schmitt | 211/26 |
| 5,868,261 | A * | 2/1999 | Collins et al. | 211/26 |
| 5,934,485 | A * | 8/1999 | Harris et al. | 211/26 |
| 7,419,061 | B1 * | 9/2008 | Dorsey | 211/26 |
| 7,472,970 | B2 * | 1/2009 | Bergesch et al. | 312/223.1 |
| 7,652,879 | B2 * | 1/2010 | Hartman et al. | 361/679.39 |
| 2009/0152216 | A1 * | 6/2009 | Champion et al. | 211/26 |
| 2009/0178986 | A1 * | 7/2009 | Coglitore et al. | 211/26 |
| 2009/0261214 | A1 * | 10/2009 | Beauchamp et al. | 248/74.1 |
| 2010/0051563 | A1 * | 3/2010 | Schreiber | 211/26 |

* cited by examiner

*Primary Examiner* — Sarah Purol
(74) *Attorney, Agent, or Firm* — Pillsbury Winthrop Shaw Pittman LLP

(57) ABSTRACT

A chassis for a data storage device enclosure is disclosed. The chassis comprises a bay arranged to receive a module and a key in the bay. The bay key is constructed and arranged such that a module can be received in the bay only when said module has a corresponding module key. The bay key is manually reconfigurable by a user without use of a tool from a first configuration in which only a module having a corresponding first key can be received in the bay to a second configuration in which only a module having a corresponding second key, which is different from the first key, can be received in the bay.

16 Claims, 7 Drawing Sheets

CHASSIS AND MODULE FOR DATA STORAGE DEVICE ENCLOSURE AND METHODS OF RECONFIGURING CHASSIS AND MODULE

This application claims the benefit of priority to U.S. application Ser. No. 60/929,566, filed Jul. 3, 2007, the content of which is hereby incorporated by reference.

The present invention relates to a chassis for a data storage device enclosure, a module for a data storage device enclosure and to methods of reconfiguring a chassis and a module.

Data storage device enclosures known in the prior art are typically highly modular. These commonly comprise a chassis containing a midplane into which various modules can be plugged. The chassis provides data storage module bays at the front of the enclosure for receiving disk drive assemblies mounted in carriers. The chassis provides other bays at the rear of the enclosure for receiving various other modules, such as power supply units, cooling modules and controller modules. Some or all of the modules are normally removable from the chassis, allowing replacement of failed modules or upgrading or changing the functionality of the enclosure. Many layouts and configurations of data storage enclosures are possible and, indeed, available commercially.

For various reasons, an enclosure may sometimes be manufactured wherein a bay of the enclosure is physically compatible with more than one type of module, some of which are intended for use with that enclosure and some of which are not. For example, a chassis may be used to manufacture more than one type of enclosure so that the modules intended for each are physically interchangeable. Furthermore, some physically compatible modules may be electrically incompatible with the enclosure such that inserting them into the enclosure could cause damage to the enclosure or to the module or both. It is therefore sometimes desirable to provide some form of keying on the chassis and modules that allows only fully compatible modules to be inserted into the enclosure and blocks other modules from being inserted.

In known schemes, the keying on the chassis is commonly provided by a physical structure in the side wall of the module bay that presents a predetermined characteristic profile to the module when inserted. The modules for use with the chassis are also keyed. If the module key "matches" the chassis key, then the two keys can pass each other so that the module can be fully inserted into the enclosure. If the module is differently keyed from the chassis, then the keys obstruct each other and the module is prevented from being fully inserted. As an example of such a scheme, the Storage Bay Bridge (SBB) specification defines a basic keying function including four distinctive key positions.

The key structure of the chassis has been implemented in various ways in the prior art. For example, where the side wall of the chassis is moulded, the key structure may be provided by a projection that is permanently moulded in the side wall. Where the side wall of the chassis is manufactured from sheet metal, the key structure may be provided by a projection that is permanently pressed into the sheet metal. Alternatively, the key structure may be provided a cap-head screw fastened into the side wall at a predetermined position. The projection or the head of the cap-head screw then clears or obstructs a projection in the module.

During the lifespan of a particular chassis, it is sometimes desired to use the chassis in a new type of enclosure, such that the chassis is required to accept a different combination of mid-plane and modules. For this, it is necessary to change the keying of the chassis to match the new modules with which it is now intended to be used. This is problematic to achieve with prior art chasses and their keying arrangements. For example, where the key structure is permanently formed in the side wall (i.e. moulded or pressed into the structure), it will be practically impossible to change the keying of the chassis without effectively remaking the chassis. Where a cap-head screw is used for the key, it would in principle be possible to move the screw to a different position to change the keying of the chassis. However, this has the drawback that a tool is required (for example, an allen key or wrench), and so the user is presented with difficulties in making sure that the correct tool is at hand and also in accessing the key structure inside the chassis with the tool. Also, the tool or the screw may be dropped and may be accidentally left in the chassis.

However the key structure is implemented, the key structure should be preferably simple to manufacture in order to keep down manufacturing costs.

According to a first aspect of the present invention, there is provided a chassis for a data storage device enclosure, the chassis comprising: a bay arranged to receive a module; and, a key in the bay, the bay key being constructed and arranged such that a module can be received in the bay only when said module has a corresponding module key, the bay key being manually reconfigurable by a user without use of a tool from a first configuration in which only a module having a corresponding first key can be received in the bay to a second configuration in which only a module having a corresponding second key, which is different from the first key, can be received in the bay.

This provides a chassis where the user or manufacturer can easily change the keying of the chassis to allow the chassis to be used with a different type of module. This can be done manually by the user or manufacturer without the need for tools. One advantage is that a supply of only one type of chassis needs to be stocked. It is a simple operation to change the configuration of the storage enclosure at a later point in the manufacturing process. This makes it easier to extend the useful life of a chassis by reusing it for more than one configuration of enclosure and/or module.

In a preferred embodiment, the bay key comprises: at least one key element; and, a key holder constructed and arranged to hold the key element in at least two different positions which correspond respectively to the first and second configurations. This allows the bay key to be easily reconfigured.

In a preferred embodiment, the key holder comprises a plurality of holes therethrough; and, the key element comprises a base portion and a projecting portion; wherein the key element is removably receivable by each of said holes such that at least part of the projecting portion projects beyond the key holder and the base portion holds the key element in place in the holes. This provides a convenient way of allowing the key elements to be moved so as to easily change the configuration of the bay key. The preferred arrangement is simple for the user to handle as well as being simple to manufacture and yet robust in use.

The chassis may comprise a plurality of key elements held by the key holder. By introducing more than one key element, the number of permutations of the bay key is increased, allowing a greater number of different types of modules to be uniquely keyed to a bay of a chassis.

In a preferred embodiment, the chassis comprises an attachment arrangement for attaching the bay key to the chassis, the attachment arrangement being manually operable by a user without a tool to attach and detach the bay key to and from the chassis to allow the bay key to be configured between the first and second configurations. This allows the bay key to be manually detached and removed from the chassis by the user, whereupon the keying of the bay key can be altered, for example by moving the position of one or more key elements in a key holder as described above or by swapping the bay key for another bay key.

In a preferred embodiment, the attachment arrangement is constructed and arranged to slidably receive the bay key into a received position and comprises a catch arranged to hold the bay key in place when in the received position. The attachment arrangement can be simply manufactured, for example by pressing or moulding the structure into the chassis as part of the process of manufacturing the chassis, for example as part of the process that forms the guide runners in the side walls of the chassis.

In a preferred embodiment, the catch comprises a resilient arm having an engagement portion arranged to engage with and prevent movement of the bay key out of the received position, the arm having a contact portion that is accessible by a user when the bay key is in the received position and by which the user can apply a force to deflect the arm to release the bay key. This provides a simple and secure way of holding the key assembly in position. The catch can be simply operated and simply manufactured, for example by pressing or moulding the various structures into the chassis as part of the process of manufacturing the chassis.

The chassis may comprise a plurality of bay keys per module bay. This allows the number of permutations of the key for a particular bay to be increased, allowing a greater number of different types of modules to be uniquely keyed to the bay.

According to a second aspect of the present invention, there is provided a module for a data storage device enclosure, the module comprising: a module body; and, a key on the module body, the module key being constructed and arranged such that the module can be received in a bay of a said data storage device enclosure only when said bay has a corresponding key, the module key being manually reconfigurable by a user without use of a tool from a first configuration in which the module can be received only in a bay having a corresponding first key to a second configuration in which the module can be received only in a bay having a corresponding second key, which is different from the first key.

According to a third aspect of the present invention, there is provided a method of reconfiguring a chassis for a data storage enclosure from a first configuration in which only a module having a first key can be received in a bay of the chassis to a second configuration in which only a module having a second key, which is different from the first key, can be received in the bay, the method comprising: manually reconfiguring without the use of a tool a key in the bay from a first configuration in which only a module having a corresponding first key can be received in the bay to a second configuration in which only a module having a corresponding second key, which is different from the first key, can be received in the bay.

According to a fourth aspect of the present invention, there is provided a method of reconfiguring a module for a data storage enclosure from a first configuration in which the module can be received only in a bay of an enclosure having a first key to a second configuration in which the module can be received only in a bay of an enclosure having a second key, which is different from the first key, the method comprising: manually reconfiguring without the use of a tool a key on the module from a first configuration in which the module can be received only in a bay of an enclosure having a first key to a second configuration in which the module can be received only in a bay of an enclosure having a second key, which is different from the first key.

Embodiments of the present invention will now be described by way of example with reference to the accompanying drawings, in which.

Figure 1:
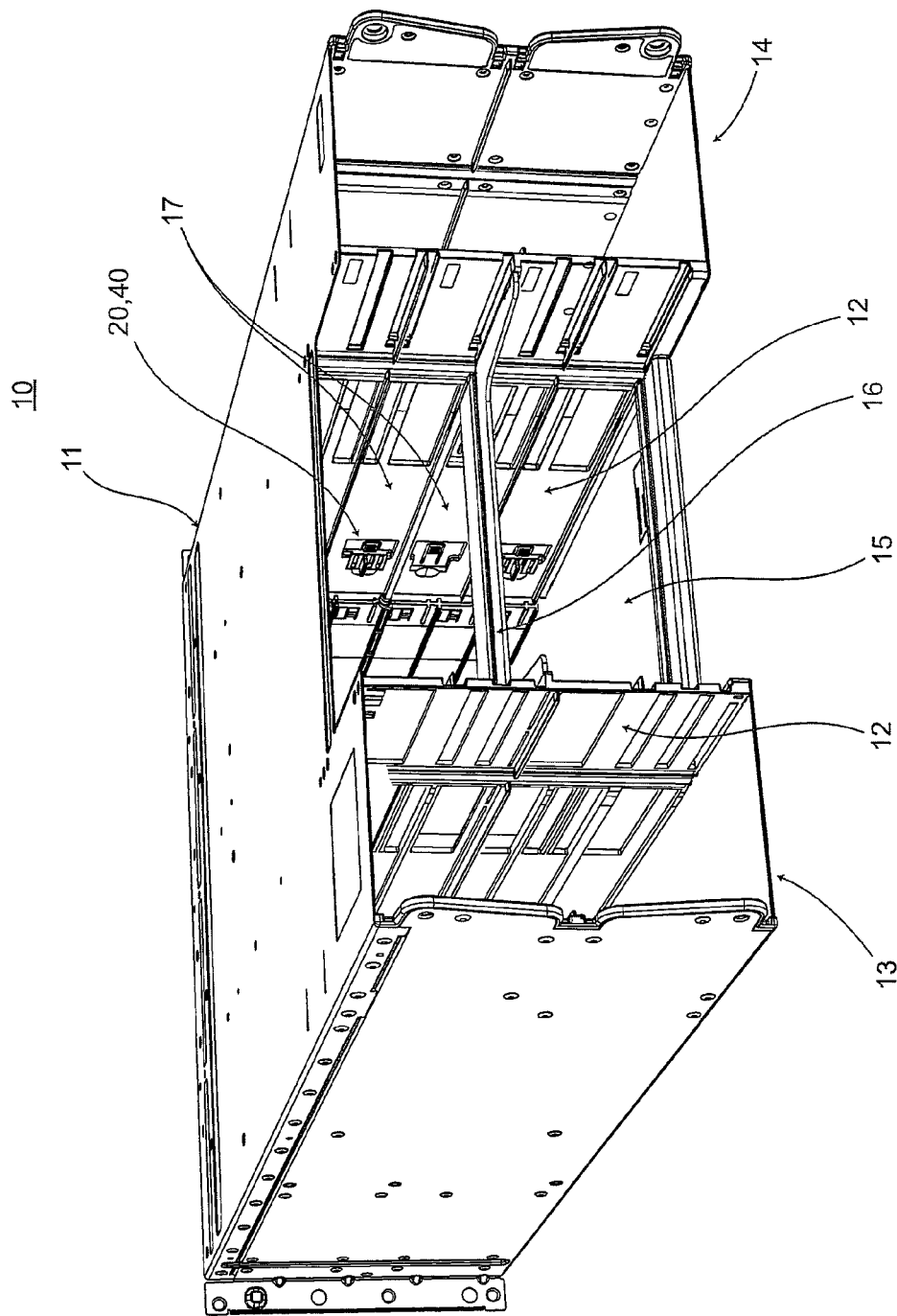
FIG. 1 shows a perspective view from the rear of an example of a chassis according to an embodiment of the present invention.
Figure 5:
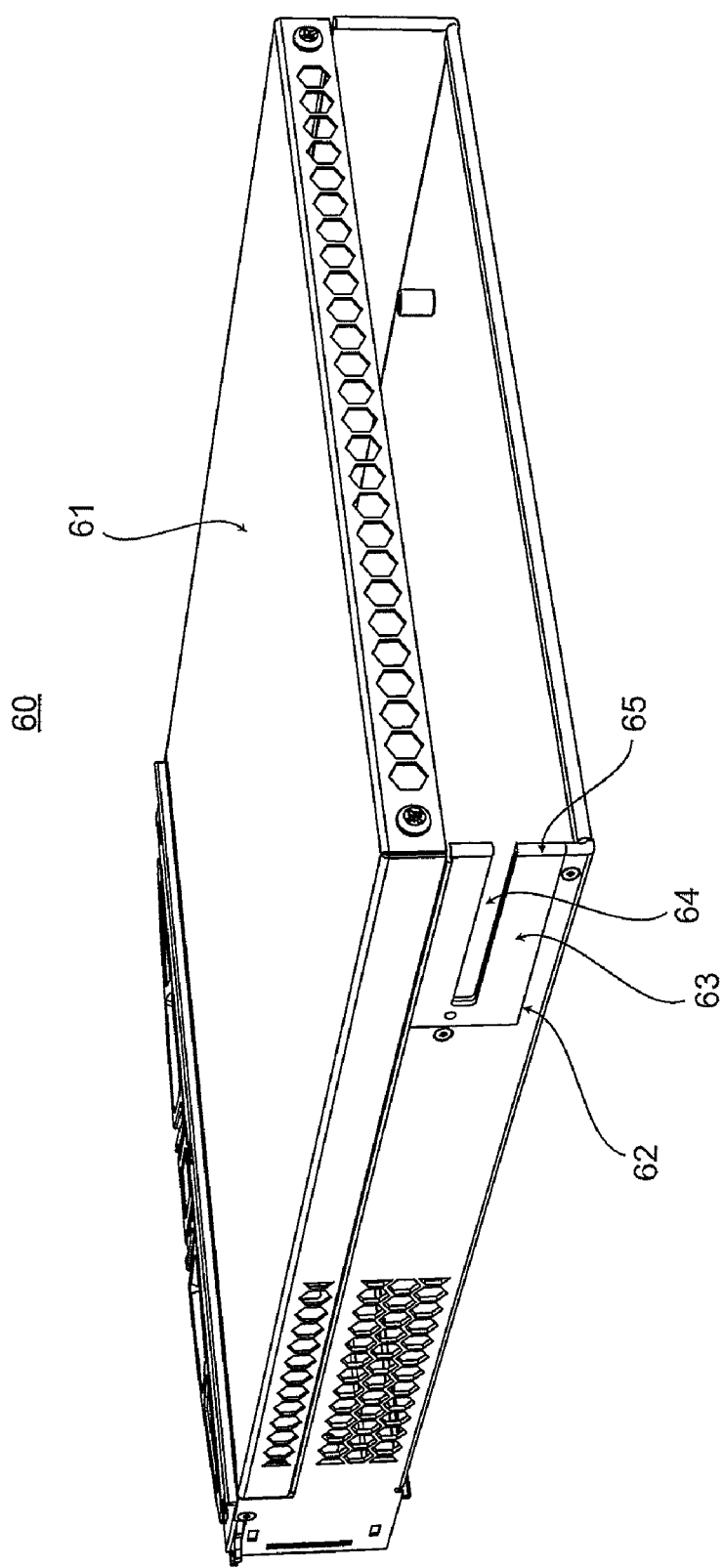
FIG. 5 shows a perspective view from the rear of a module for use with the chassis of FIG. 1.

Referring to FIG. 1, a chassis 10 for a data storage device enclosure is shown from the rear. The chassis 10 generally comprises a box-like housing 11, having vertical interior walls 12. The chassis 10 has a plurality of bays at the front for receiving disk drive assemblies in carriers (not shown). At the rear of the chassis 10 there are two bays 13,14 at either side for receiving power supply modules (not shown). Between the power supply bays 13,14 are two bays 15,16, one on top of the other, for receiving controller modules 60 (for example, as shown by FIG. 5). There is also provision made within the chassis 10, between the front bays and the rear bays, for holding a midplane (not shown) which provides data and power connections between the various modules.

The vertical interior walls 12 of the chassis 10 have guide runners 17 formed thereon or attached thereto that allow the various modules to be guided into and out of their positions in the chassis 10. The guide runners 17 may also sub-divide the bays 13,14,15,16 into smaller bays. In the present example, the chassis 10 is for a storage enclosure having a height of 4U. Each power supply bay 13,14 has a height of 4U and can accommodate two power supply modules of height 2U or a single power supply module of height 4U. Each controller module bay 15,16 has a height of 2U and can accommodate two controller modules 60 of height U or one controller module 60 of height 2U.

As shown by FIG. 1, the vertical walls 12 of the controller module bays 15,16 have attachment arrangements 40 positioned between the guide runners 17, by which key assemblies 20 can be attached to the chassis 10 (for clarity, not every attachment arrangement 40 is shown holding a key assembly 20 in FIG. 1). A key assembly 20 comprises a key holder 21 and at least one key element 30 held in the key holder 21 at a predetermined location so as to project into the module bay 15,16. The key assembly 20 allows only a module 60 with a corresponding key to be inserted into the bay 15,16 and blocks all differently keyed modules 60.

Figure 2A:
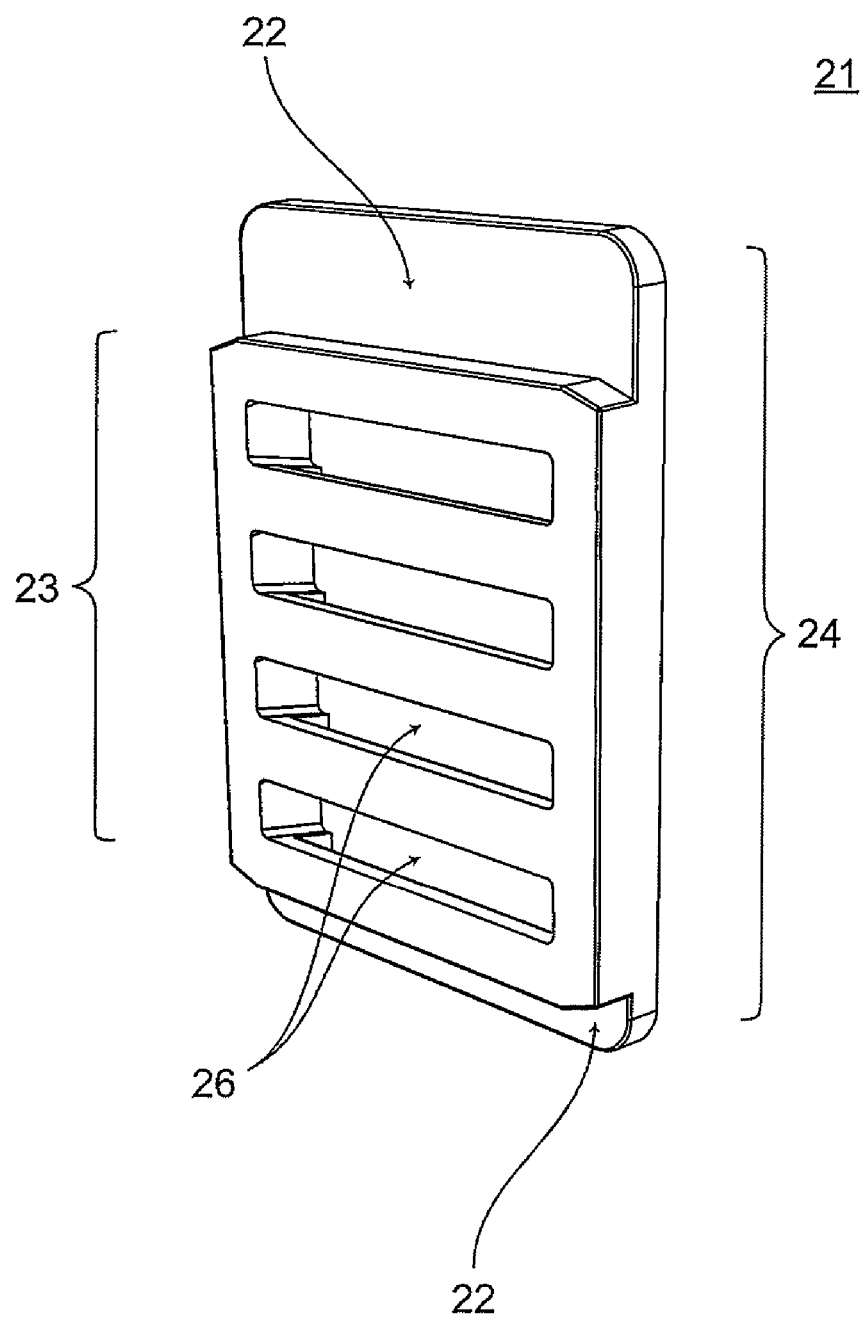
FIGS. 2A and 2B show perspective views from the front and from the rear respectively of an example of a key holder for use with the chassis shown by FIG. 1.
Figure 2B:
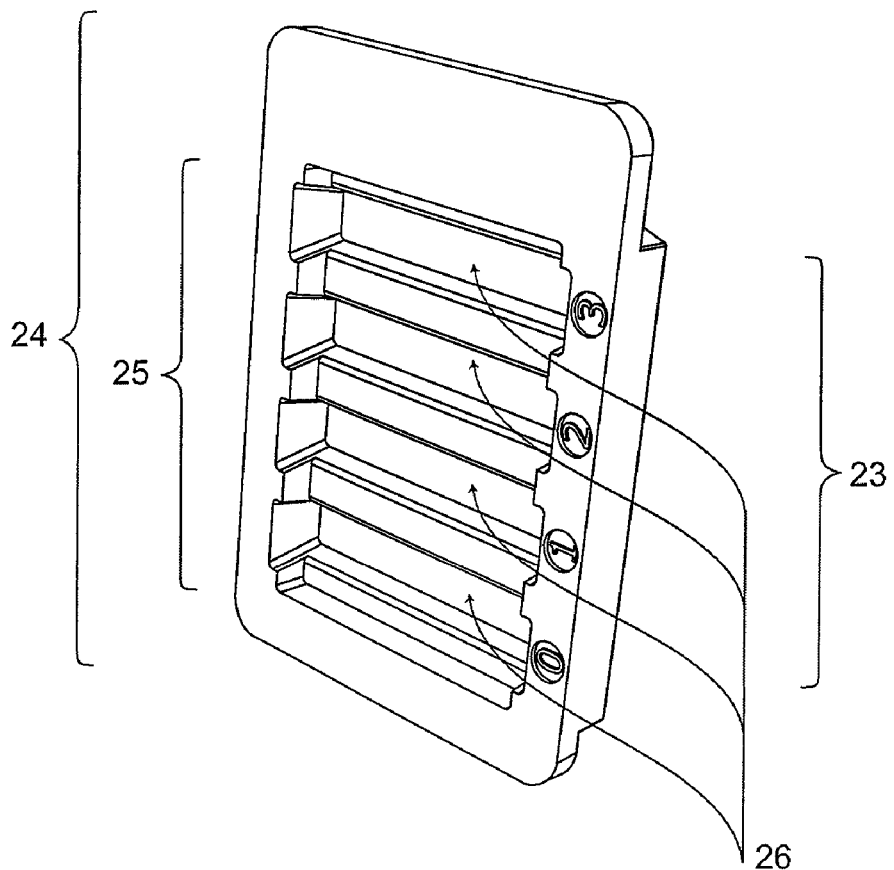

FIGS. 2A and 2B show a key holder 21 viewed from the front and from the rear respectively. The key holder 21 has a generally flat cuboid body with recessed portions 22 at the top and bottom edge of its front face, forming in effect a raised rectangular portion 23 on top of a larger rectangular base portion 24. On the rear face of key holder 21 is a recessed rectangular area 25. The recessed area 25 approximately overlies the raised portion 23. Within the footprint of the raised portion 23 and recessed area 25, four slotted holes 26 extend through the body of the key holder 21.

Figure 3A:
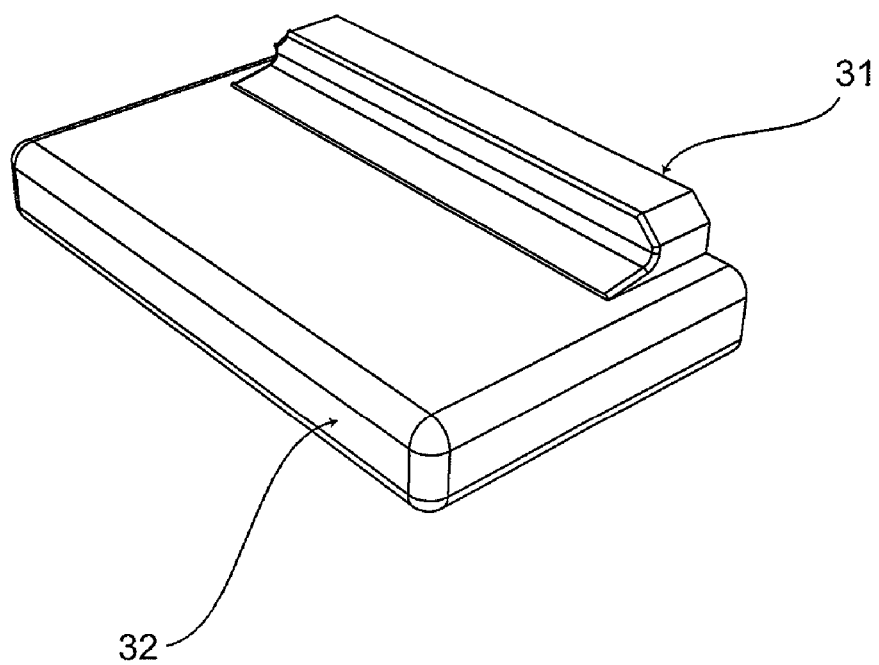
FIGS. 3A and 3B show perspective views from the front and from the rear respectively of an example of a key element for use with the chassis shown by FIG. 1.
Figure 3B:
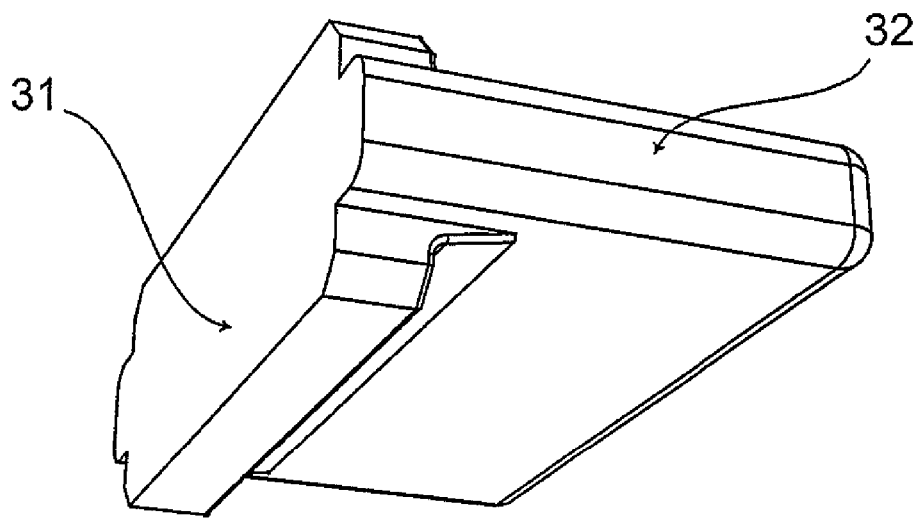

FIGS. 3A and 3B show a key element 30. The key element 30 comprises a base portion 31 and a projecting or tab portion 32 extending from the base portion 31. The base portion 31 thus in effect forms flanges at one end of the tab portion 32. The tab portion 32 is sized to be insertable through any of the holes 26. When fully inserted through a hole 26 from the recessed side of the key holder 21, the base portion 31 is received within the recessed area 25 and retains the key element 30 in place. When fully inserted, the tab portion 32 projects a predetermined distance beyond the front surface of the key holder 21, in the present example by about 1 cm.

Figure 4:
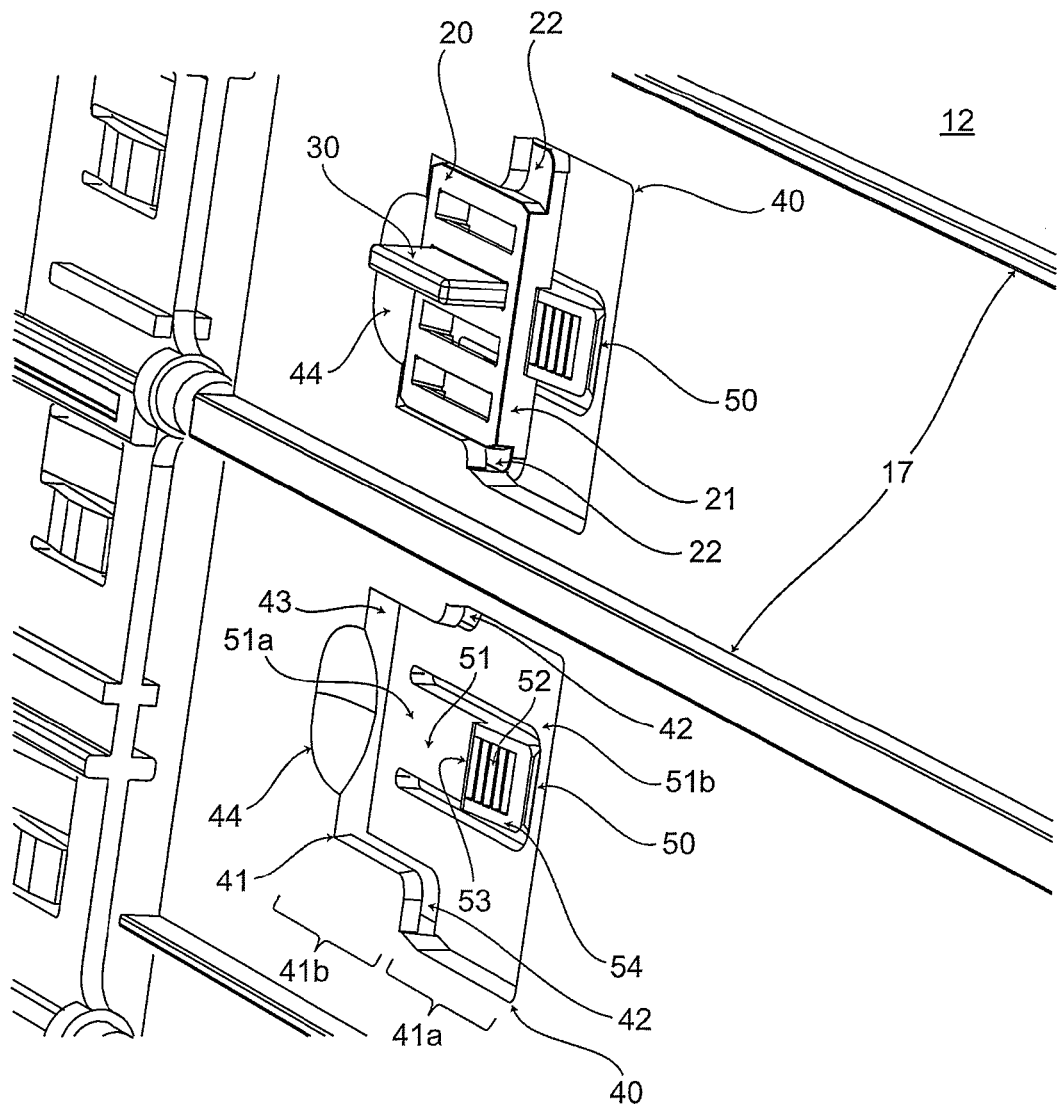
FIG. 4 shows a detail view of part of the chassis of FIG. 1.

FIG. 4 shows an enlarged portion of FIG. 1, showing an interior vertical wall 12 of the controller module bays 15,16 and showing in more detail the attachment arrangement 40 that attaches the key assembly 20 to the chassis 10. The attachment arrangement 40 is arranged to attach the key holder 21 in place via a latching mechanism as follows. The attachment arrangement 40 comprises a recess 41 in the vertical wall 12 having a depth approximately equal to the thickness of the key holder 21. The recess 41 has a first portion 41a towards the rear of the chassis 10, the opening of which is sized to allow entry of the base portion 24 of the key holder 21. The recess 41 has a second portion 41b further into the chassis 10 (i.e. towards the front of the chassis 10), arranged to slidably receive the key holder 21 from the first portion 41a. In particular, the opening of the second portion 41b is sized to allow entry of the raised portion 23 of the key holder 21, and the walls defining the second portion 41b have slots 42 at the top and bottom that are arranged to allow entry of the top and bottom recessed portions 22 of the key holder 21. Thus, the key holder 21 may be placed in the first portion 41a of the recess 41 and slid inwards until received in the second portion 41b (the received position), in which position the far edge of the key holder 21 abuts the far wall 43 of the recess 41.

The attachment arrangement 40 also comprises a catch 50 for releasably locking the key holder 21 in place in the received position. The catch 50 comprises a resilient arm 51 that lies generally in the plane of the vertical interior wall 12 within the recess 41 in an aperture in the wall 12. The arm 51 is attached to the wall 12 at one end 51a towards the front of the chassis 10, and has a locking tab 52 at the other end 51b towards the rear of the chassis 10. In its normal unbiased position, the arm 51 extends flush with the vertical wall 12 within the recess 41 and the locking tab 52 projects a small distance from the arm 51 inwardly of the bay 15,16. The locking tab 52 has a sloped surface 53 that slopes inwardly of the bay 15,16 towards the front of the chassis 10, and an abutting surface 54 that generally faces away from the rear of the chassis 10. When the key holder 21 is in the received position, the abutting surface 54 is positioned so as to be adjacent to the side of the key holder 21, thereby preventing it from being withdrawn, thereby locking it into its received position.

Thus, to attach the key holder 21 to the chassis 10, the user grasps the key holder 21, places it into the first portion 41a of the recess 41 and then slides it towards the second portion 41b of the recess 41. The arm 51 is deflected downwards during this operation due to the key holder 21 sliding against the sloping surface 54 of the locking tab 52. As the key holder 21 moves fully into the second portion 41b of the recess 41, it moves beyond the locking tab 52, whereupon the arm 51 springs back to its non-deflected position due to its resiliency, and the abutting surface 54 moves into position adjacent the edge of the key holder 21 thereby preventing it from being withdrawn.

To remove the key holder 21 from the chassis 10, the user depresses the catch 50 by pressing on the sloped surface 53 of the locking tab 52. As can be seen from FIG. 4, the locking tab 52 is accessible by the user even when the key holder 21 is in the received position. The sloped surface 53 may be ridged to allow a better grip for the user and/or to allow the user to locate the sloped surface 53 by feel alone. The user then draws the key holder 21 towards the rear of the chassis 10. The user may grip the key holder 21 for example between thumb and forefinger: the forefinger gripping the far edge of the key holder 21, which is made accessible by an depression 44 in the far wall 43 of the recess 41 adjacent to the far edge of the key holder 21; and the thumb depressing the catch 50 by applying a lateral force to the locking tab 52 at the same time as pressing against the near edge of the key holder 21.

Thus the key assembly 20 is manually removable and insertable by the user simply and without the need to use any tools. If the user needs to alter the keying of the chassis 10, this can be simply done by removing the key assembly 20 as described above, and then moving the key element 30 to a different hole 26 in the key holder 21 to change the key of the key assembly 20. The key assembly 20 is then replaced in the chassis 10. Again, the process requires no tools and is quick and simple for the user.

FIG. 5 shows a perspective view from the rear of a module 60 (i.e. the end which connects to the midplane of the enclosure) for use with the chassis 10 of FIG. 1. The module 60 comprises a housing 61. The module 60 has a key 62 on one side face at the rear of the housing 61. The key 62 comprises a plate 63 with a slot 64 therein, which is open at the rear and extends towards the front of the module 60. The vertical position of the slot 64 is predetermined to correspond with the vertical position of one of the holes 26 in the key holder 21 attached to the bay 15,16. If that particular hole 26, and no other hole 26, holds a key element 30, then the bay 15,16 has a corresponding key to the module 60, such that the key element 30 is received in the slot 64 as the module 60 is advanced into the bay 15,16, allowing the module 60 to be fully inserted into the bay 15,16 by the user. If the key holder 21 has a key element 30 in another hole 26, then that key element 30 will hit the rearmost edge 65 of the plate 63 as the module 60 is advanced into the bay 15,16, and the module 60 is prevented from being fully inserted into the bay 15,16.

An advantage of the present chassis 10 is that the key assembly 20 is slid into the received position in the same direction in which a module 60 is inserted into the bay 15,16, i.e. from the rear and towards the front of the chassis 10. Thus when a user attempts to insert a module 60 in the bay 15,16 that has a different key to the key assembly 20 attached to the bay 15,16, such that the keys obstruct each other, the key assembly 20 is forced against the far wall 43 of the recess 41. Thus the far wall 43 is subjected to the insertion force of the module 60. As the far wall 43 is formed from the vertical interior wall 12 of the chassis 10, it is therefore a relatively robust structure that is capable of withstanding a high insertion force. In contrast, the robust catch 50 arrangement bears little or none of the insertion force, and thus need not be as robust. This helps avoid the possible damage being caused to the catch 50 when a differently-keyed module 60 is inserted.

The elements of the keying arrangement herein described may be simply and economically manufactured. The key holder 21 and key element 30 may be formed for example by conventional plastics moulding. Where the vertical walls 12 of the chassis 10 are made from stamped sheet metal, for example mild steel or aluminium, the attachment arrangement 40 may be formed as part of the stamping process. Where the vertical walls 12 are moulded, for example from a thermoplastic, the attachment arrangement 40 can be formed as part of the moulding process. The overall arrangement can therefore be manufactured at little extra cost.

The example described here makes use of only one key element 30 per key holder 21 and one key assembly 20 per module bay 15,16. In other examples, the chassis 10 may have two or more key assemblies 20 per module bay 15,16, and/or may specify two or more key elements 30 per key holder 21. This allows a greater number of key permutations to be provided for keying a module 60 to the chassis 10. Also, the attachment arrangement 40 can be used advantageously with key assemblies 20 where the key elements 30 are permanently fixed to the key holder 21 rather than being movable to new positions in the key holder 21. In this scheme (not shown), in order to change the keying of the chassis 10, it would be necessary to remove the currently attached key assembly 20 and replace it with a different key assembly 20.

Alternatively or additionally to the attachment arrangement 40 being provided on the chassis 10, the key assembly 20 may be provided on the modules 60 themselves.

Embodiments of the present invention have been described with particular reference to the examples illustrated. However, it will be appreciated that variations and modifications may be made to the examples described within the scope of the present invention.

The invention claimed is:

1. A chassis for a data storage device enclosure, the chassis comprising:
   a bay arranged to receive a module; and,
   a key in the bay, the bay key being constructed and arranged such that a module can be received in the bay only when said module has a corresponding module key, the bay key being manually reconfigurable by a user without use of a tool from a first configuration in which only a module having a corresponding first key can be received in the bay to a second configuration in which only a module having a corresponding second key, which is different from the first key, can be received in the bay,
   wherein the bay key comprises:
   at least one key element; and,
   a key holder constructed and arranged to hold the key element in at least two different positions which correspond respectively to the first and second configurations.

2. A chassis according to claim 1, wherein
   the key holder comprises a plurality of holes therethrough; and,
   the key element comprises a base portion and a projecting portion;
   wherein the key element is removably receivable by each of said holes such that at least part of the projecting portion projects beyond the key holder and the base portion holds the key element in place in the holes.

3. A chassis according to claim 1, comprising a plurality of key elements held by the key holder.

4. A chassis for a data storage device enclosure, the chassis comprising:
   a bay arranged to receive a module;
   a key in the bay, the bay key being constructed and arranged such that a module can be received in the bay only when said module has a corresponding module key, the bay key being manually reconfigurable by a user without use of a tool from a first configuration in which only a module having a corresponding first key can be received in the bay to a second configuration in which only a module having a corresponding second key, which is different from the first key, can be received in the bay, and
   an attachment arrangement for attaching the bay key to the chassis, the attachment arrangement being manually operable by a user without a tool to attach and detach the bay key to and from the chassis to allow the bay key to be configured between the first and second configurations, wherein the attachment arrangement is constructed and arranged to slidably receive the bay key into a received position and comprises a catch arranged to hold the bay key in place when in the received position.

5. A chassis according to claim 4, wherein the catch comprises a resilient arm having an engagement portion arranged to engage with and prevent movement of the bay key out of the received position, the arm having a contact portion that is accessible by a user when the bay key is in the received position and by which the user can apply a force to deflect the arm to release the bay key.

6. A chassis according to claim 1, comprising a plurality of bay keys per module bay.

7. A module for a data storage device enclosure, the module comprising:
   a module body; and,
   a key on the module body, the module key being constructed and arranged such that the module can be received in a bay of said data storage device enclosure only when said bay has a corresponding key, the module key being manually reconfigurable by a user without use of a tool from a first configuration in which the module can be received only in a bay having a corresponding first key to a second configuration in which the module can be received only in a bay having a corresponding second key, which is different from the first key,
   wherein the module key comprises:
   at least one key element; and,
   a key holder constructed and arranged to hold the key element in at least two different positions which correspond respectively to the first and second configurations.

8. A module according to claim 7, wherein
   the key holder comprises a plurality of holes therethrough; and,
   the key element comprises a base portion and a projecting portion;
   wherein the key element is removably receivable by each of said holes such that at least part of the projecting portion projects beyond the key holder and the base portion holds the key element in place in the holes.

9. A module according to claim 7, comprising a plurality of key elements held by the key holder.

10. A module for a data storage device enclosure, the module comprising:
    a module body;
    a key on the module body, the module key being constructed and arranged such that the module can be received in a bay of a said data storage device enclosure only when said bay has a corresponding key, the module key being manually reconfigurable by a user without use of a tool from a first configuration in which the module can be received only in a bay having a corresponding first key to a second configuration in which the module can be received only in a bay having a corresponding second key, which is different from the first key, and
    an attachment arrangement for attaching the module key to the module body, the attachment arrangement being manually operable by a user without a tool to attach and detach the module key to and from the module body to allow the module key to be configured between the first and second configurations,
    wherein the attachment arrangement is constructed and arranged to slidably receive the module key into a received position and comprises a catch arranged to hold the module key in place when in the received position.

11. A module according to claim 10, wherein the catch comprises a resilient arm having an engagement portion arranged to engage with and prevent movement of the module key out of the received position, the arm having a contact portion that is accessible by a user when the module key is in the received position and by which the user can apply a force to deflect the arm to release the module key.

12. A module according to claim 7, comprising a plurality of module keys per module.

13. A method of reconfiguring a chassis for a data storage enclosure from a first configuration in which only a module having a first key can be received in a bay of the chassis to a second configuration in which only a module having a second key, which is different from the first key, can be received in the bay, the method comprising:
 manually reconfiguring without the use of a tool a key in the bay from a first configuration in which only a module having a corresponding first key can be received in the bay to a second configuration in which only a module having a corresponding second key, which is different from the first key, can be received in the bay,
 wherein the bay key comprises:
 at least one key element; and,
 a key holder constructed and arranged to hold the key element in at least two different positions which correspond respectively to the first and second configurations, and where manually reconfiguring the bay key comprises moving the key element between the two different positions.

14. A method of reconfiguring a module for a data storage enclosure from a first configuration in which the module can be received only in a bay of an enclosure having a first key to a second configuration in which the module can be received only in a bay of an enclosure having a second key, which is different from the first key, the method comprising:
 manually reconfiguring without the use of a tool a key on the module from a first configuration in which the module can be received only in a bay of an enclosure having a first key to a second configuration in which the module can be received only in a bay of an enclosure having a second key, which is different from the first key,
 wherein the module key comprises:
 at least one key element; and,
 a key holder constructed and arranged to hold the key element in at least two different positions which correspond respectively to the first and second configurations, and where manually reconfiguring the module key comprises moving the key element between the two different positions.

15. A chassis according to claim 4, comprising a plurality of bay keys per module bay.

16. A module according to claim 10, comprising a plurality of module keys per module.

* * * * *